(12) United States Patent
Lin et al.

(10) Patent No.: US 11,664,430 B2
(45) Date of Patent: May 30, 2023

(54) SEMICONDUCTOR DEVICE

(71) Applicant: Vanguard International Semiconductor Corporation, Hsinchu (TW)

(72) Inventors: Hsin-Chih Lin, Hsinchu (TW); Chang-Xiang Hung, Budai Township (TW); Chia-Ching Huang, Taoyuan (TW); Yung-Hao Lin, Jhunan Township (TW); Chia-Hao Lee, New Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 91 days.

(21) Appl. No.: 17/313,210

(22) Filed: May 6, 2021

(65) Prior Publication Data

US 2021/0257466 A1    Aug. 19, 2021

Related U.S. Application Data

(62) Division of application No. 15/918,578, filed on Mar. 12, 2018, now Pat. No. 11,043,563.

(51) Int. Cl.
*H01L 29/40*    (2006.01)
*H01L 29/20*    (2006.01)
(Continued)

(52) U.S. Cl.
CPC ........ *H01L 29/404* (2013.01); *H01L 29/2003* (2013.01); *H01L 29/205* (2013.01);
(Continued)

(58) Field of Classification Search
CPC . H01L 29/404; H01L 29/2003; H01L 29/205; H01L 29/401; H01L 29/408;
(Continued)

(56) References Cited

U.S. PATENT DOCUMENTS

2012/0018735 A1* 1/2012 Ishii .................. H01L 29/66431
257/E29.242
2012/0126287 A1* 5/2012 Aoki .................... H01L 29/7787
257/192

(Continued)

FOREIGN PATENT DOCUMENTS

CN    102751324 A    10/2012
CN    103367403 A    10/2013
(Continued)

OTHER PUBLICATIONS

Taiwanese Office Action and Search Report for Application No. 107102512, dated Apr. 23, 2018.
(Continued)

*Primary Examiner* — Omar F Mojaddedi
(74) *Attorney, Agent, or Firm* — Birch, Stewart, Kolasch & Birch, LLP

(57) ABSTRACT

A semiconductor device includes a compound semiconductor layer disposed on a substrate, a protection layer disposed on the compound semiconductor layer, and a source electrode, a drain electrode and a gate electrode penetrating the protection layer and on the compound semiconductor layer, wherein the gate electrode is disposed between the source electrode and the drain electrode. The semiconductor device also includes a plurality of field plates disposed over the protection layer and between the gate electrode and the drain electrode, wherein the plurality of field plates are separated from each other.

15 Claims, 10 Drawing Sheets

(51) Int. Cl.
  *H01L 29/778* (2006.01)
  *H01L 29/66* (2006.01)
  *H01L 29/10* (2006.01)
  *H01L 29/205* (2006.01)
(52) U.S. Cl.
  CPC .......... *H01L 29/401* (2013.01); *H01L 29/408* (2013.01); *H01L 29/66462* (2013.01); *H01L 29/7787* (2013.01)
(58) Field of Classification Search
  CPC ........... H01L 29/66462; H01L 29/7787; H01L 29/1066; H01L 29/7786
  See application file for complete search history.

(56) References Cited

U.S. PATENT DOCUMENTS

| | | | | |
|---|---|---|---|---|
| 2012/0220089 | A1* | 8/2012 | Imada | H01L 29/66462 438/270 |
| 2013/0193485 | A1* | 8/2013 | Akiyama | H01L 29/66462 257/194 |
| 2014/0035044 | A1* | 2/2014 | Ahn | H01L 29/66863 257/365 |
| 2014/0092634 | A1 | 4/2014 | Minoura et al. | |
| 2014/0092637 | A1* | 4/2014 | Minoura | H01L 29/7787 438/572 |
| 2014/0092638 | A1 | 4/2014 | Nishimori et al. | |
| 2017/0018617 | A1* | 1/2017 | Xia | H01L 29/7786 |
| 2017/0062581 | A1 | 3/2017 | You et al. | |
| 2017/0200818 | A1* | 7/2017 | Suzuki | H01L 29/404 |

FOREIGN PATENT DOCUMENTS

| | | |
|---|---|---|
| CN | 103715252 A | 4/2014 |
| CN | 106684140 A | 5/2017 |
| TW | 201417280 A | 5/2014 |
| TW | 201511251 A | 3/2015 |

OTHER PUBLICATIONS

Chinese Office Action and Search Report for Chinese Application No. 201810100204.0, dated Jan. 4, 2022.

* cited by examiner

SEMICONDUCTOR DEVICE

CROSS REFERENCE TO RELATED APPLICATIONS

This application is a divisional application of U.S. application Ser. No. 15/918,578, filed on Mar. 12, 2018, entitled "SEMICONDUCTOR DEVICES AND METHODS FOR FABRICATING THE SAME", which is hereby incorporated herein by reference.

BACKGROUND

Technical Field

The disclosure relates to semiconductor devices, and more particularly, to semiconductor devices having field plates and methods for fabricating the same.

Description of the Related Art

Gallium nitride-based (GaN-based) semiconductor materials have many excellent characteristics, such as high thermal resistance, wide band-gap, and a high electron saturation rate. Therefore, GaN-based semiconductor materials are suitable for use in high-speed and high-temperature operating environments. In recent years, GaN-based semiconductor materials have been widely used in light-emitting diode (LED) elements and high-frequency elements, such as high electron mobility transistors (HEMT) with heterogeneous interfacial structures.

The field plate is typically disposed in the high electric field region of the semiconductor device in order to reduce the peak electric field of the high electric field region. A type of the field plate is a field plate that is in connection with the gate electrode (i.e., gate field plate), which can reduce the electric field intensity at a side the gate near the drain. Thus, the gate field plate can improve the breakdown voltage of the semiconductor device to allow the semiconductor device to be applied in high voltage operation. Another type of field plate is a field plate that is in connection with the source electrode (i.e., source field plate). The source field plate can reduce gate-to-drain capacitance (Co) due to its voltage independently controlled of the voltage of the gate, and thus the source field plate can improve the operation speed of the semiconductor device.

With the developments of GaN-based semiconductor materials, these semiconductor devices which use GaN-based semiconductor materials are applied in the more critical working environments, such as those with higher frequencies or higher temperatures. Therefore, the process conditions of fabricating semiconductor devices with GaN-based semiconductor materials face various new challenges.

SUMMARY

Some embodiments of the present disclosure provide a semiconductor device. The semiconductor device includes a compound semiconductor layer disposed on a substrate and a protection layer disposed on the compound semiconductor layer. The semiconductor device also includes a source electrode, a drain electrode and a gate electrode penetrating the protection layer and on the compound semiconductor layer. The gate electrode is disposed between the source electrode and the drain electrode. The semiconductor device also includes a plurality of field plates disposed over the protection layer and between the gate electrode and the drain electrode. The plurality of field plates are separated from each other.

Some embodiments of the present disclosure provide a semiconductor device. The semiconductor device includes a compound semiconductor layer disposed on a substrate, a first protection layer disposed on the compound semiconductor layer, and a second protection layer disposed on the first protection layer. The semiconductor device also includes a source electrode, a drain electrode and a gate electrode disposed between the source electrode and the drain electrode. The source electrode, the drain electrode and the gate electrode penetrate the second protection layer and the first protection layer and are on the compound semiconductor layer. The semiconductor device also includes a first field plate disposed between the gate electrode and the drain electrode and a second field plate disposed between the drain electrode and the first field plate. The first field plate penetrates second protection layer and is on the first protection layer. The second field plate is on the second protection layer. The gate electrode, the first field plate and the second field plate are separated from each other Some embodiments of the present disclosure provide a method for fabricating a semiconductor device. The method includes forming a compound semiconductor layer on a substrate, forming a first protection layer on the compound semiconductor layer, forming a gate electrode penetrating the first protection layer and on the compound semiconductor layer, and forming a plurality of field plates over the first protection layer. The plurality of field plates are separated from each other. The method also includes forming a source electrode and a drain electrode penetrating the first protection layer and on the compound semiconductor layer. The gate electrode is between the source electrode and the drain electrode, and the plurality of field plates are between the gate electrode and the drain electrode.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn in scale, wherein.

DETAILED DESCRIPTION

Figure 1A:
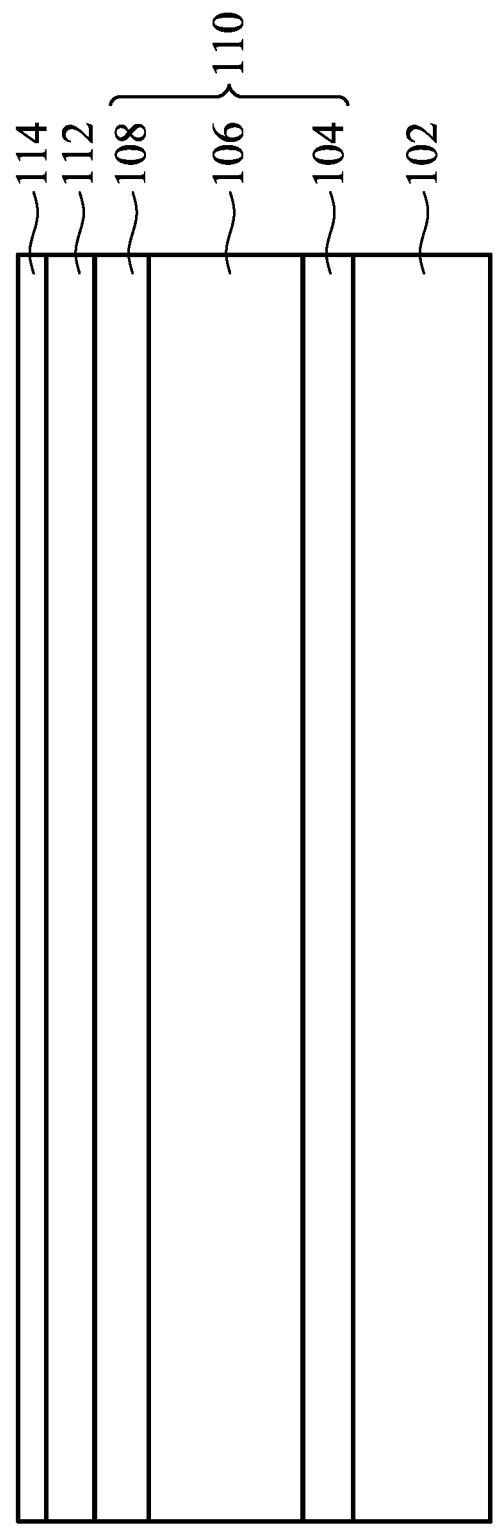
FIGS. 1A-1E illustrate cross-sectional views of forming a semiconductor device at intermediate stages in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of some embodiments are discussed below. Throughout the various views and illustrative embodiments, like reference numbers are used to designate like elements. It should be understood that additional operations can be provided before, during, and after the method, and some of the operations described can be replaced or eliminated for other embodiments of the method.

Figure 1B:
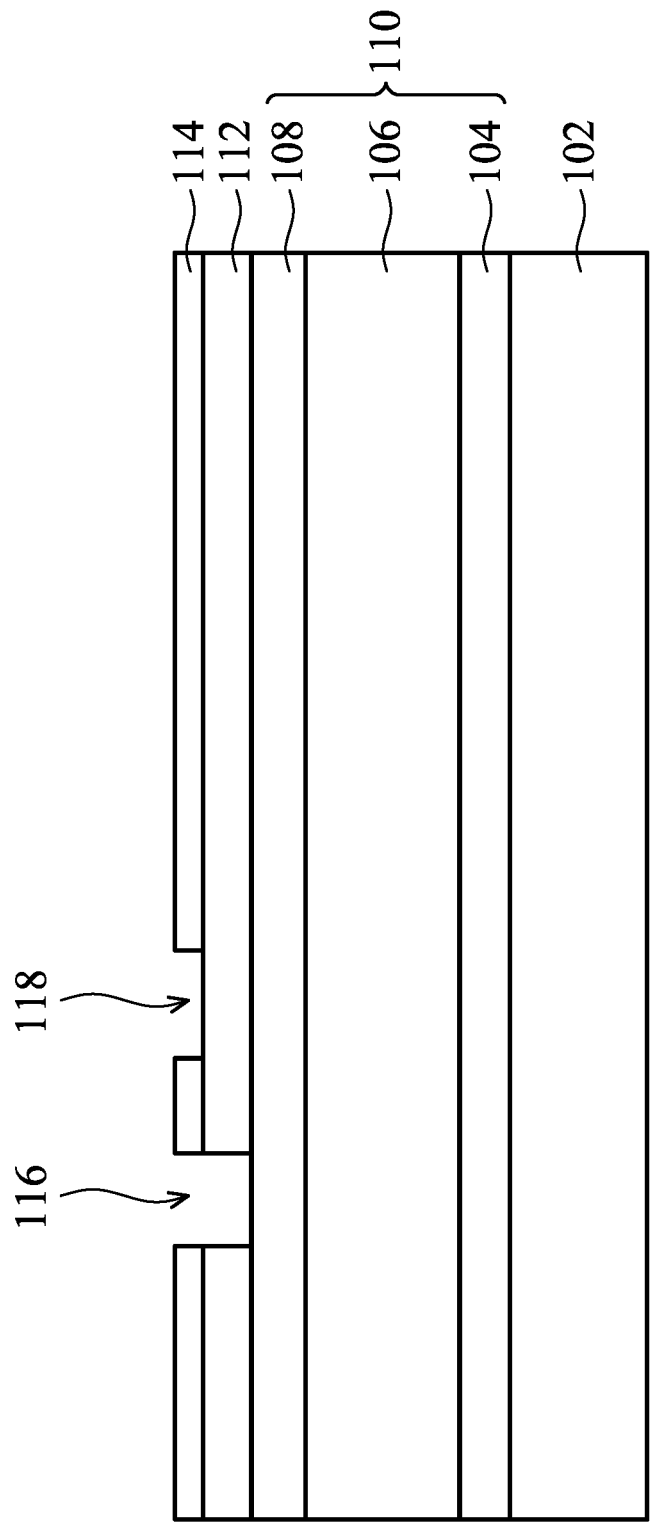
Figure 1C:
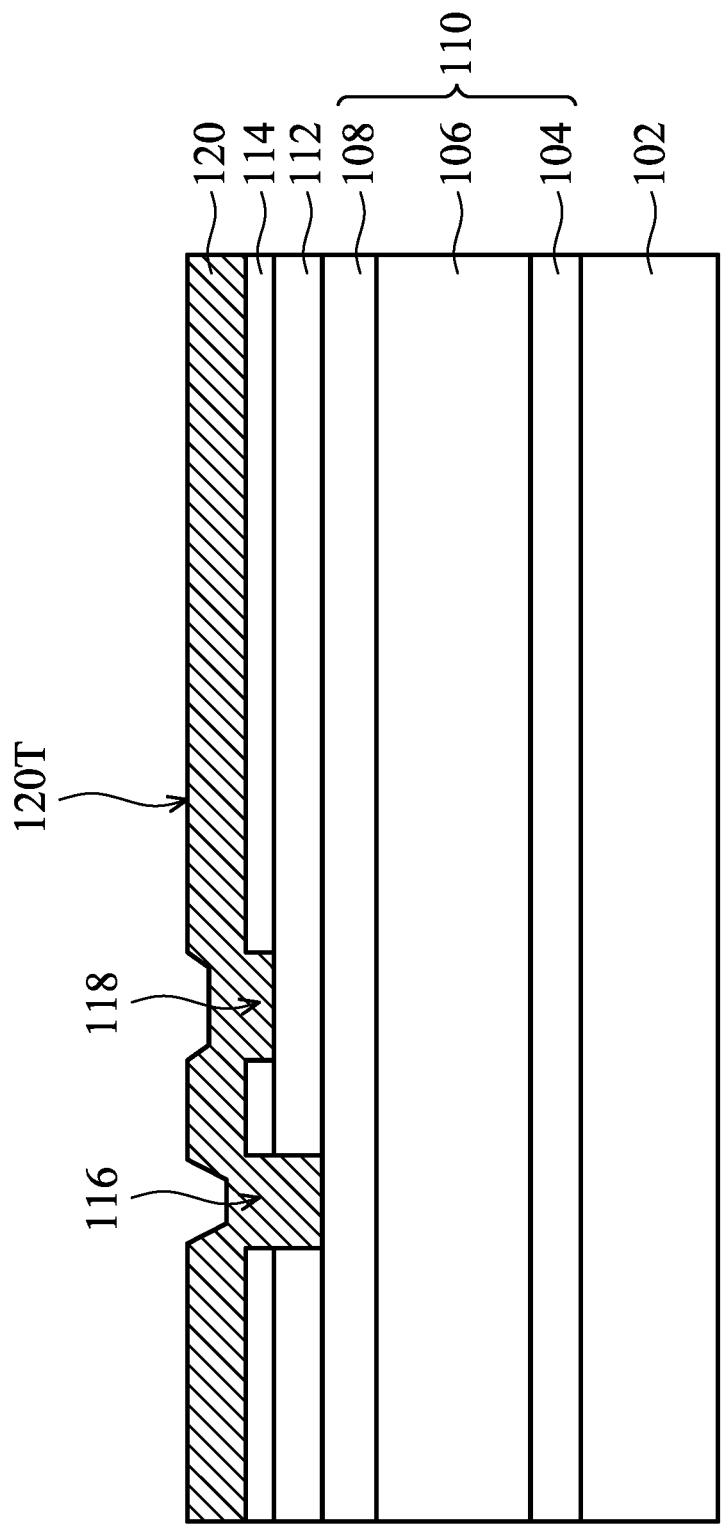
Figure 1D:
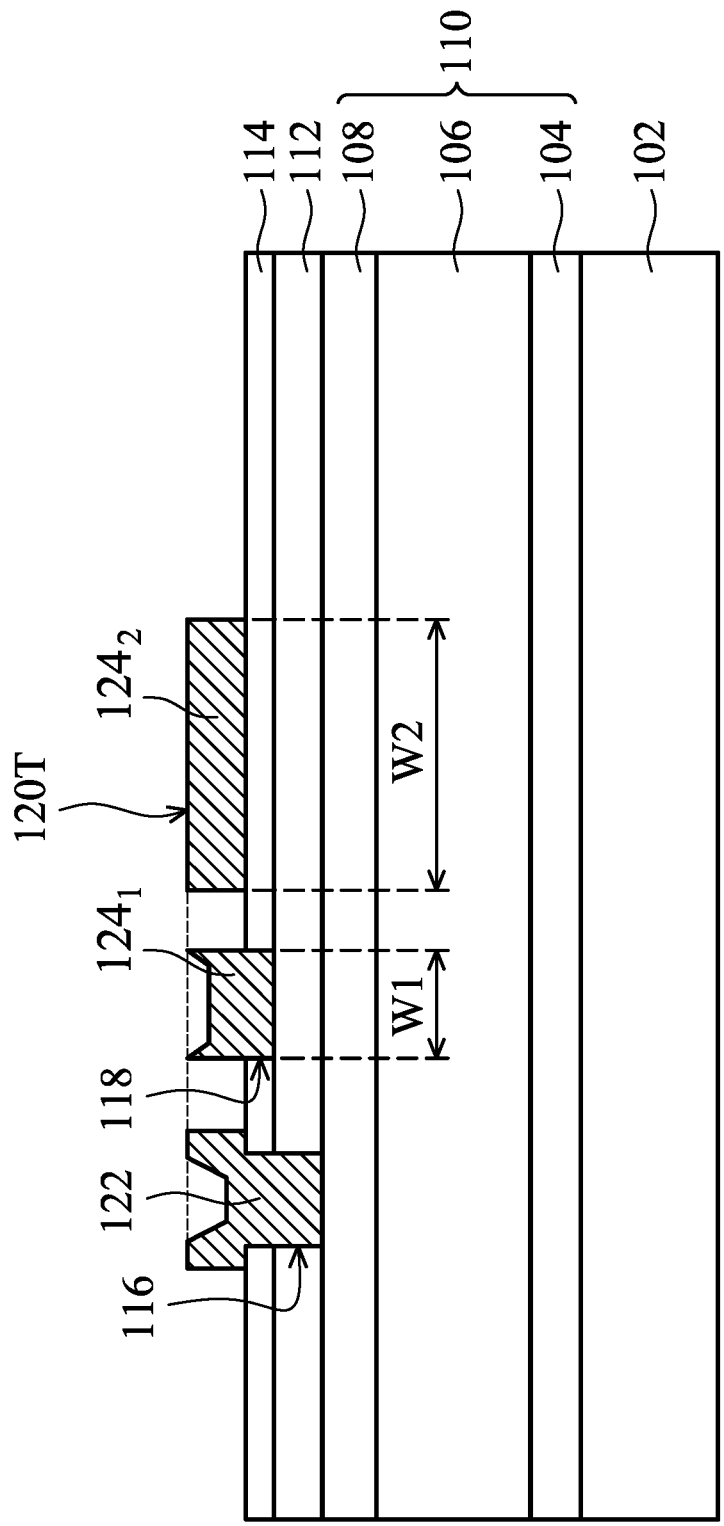
Figure 1E:
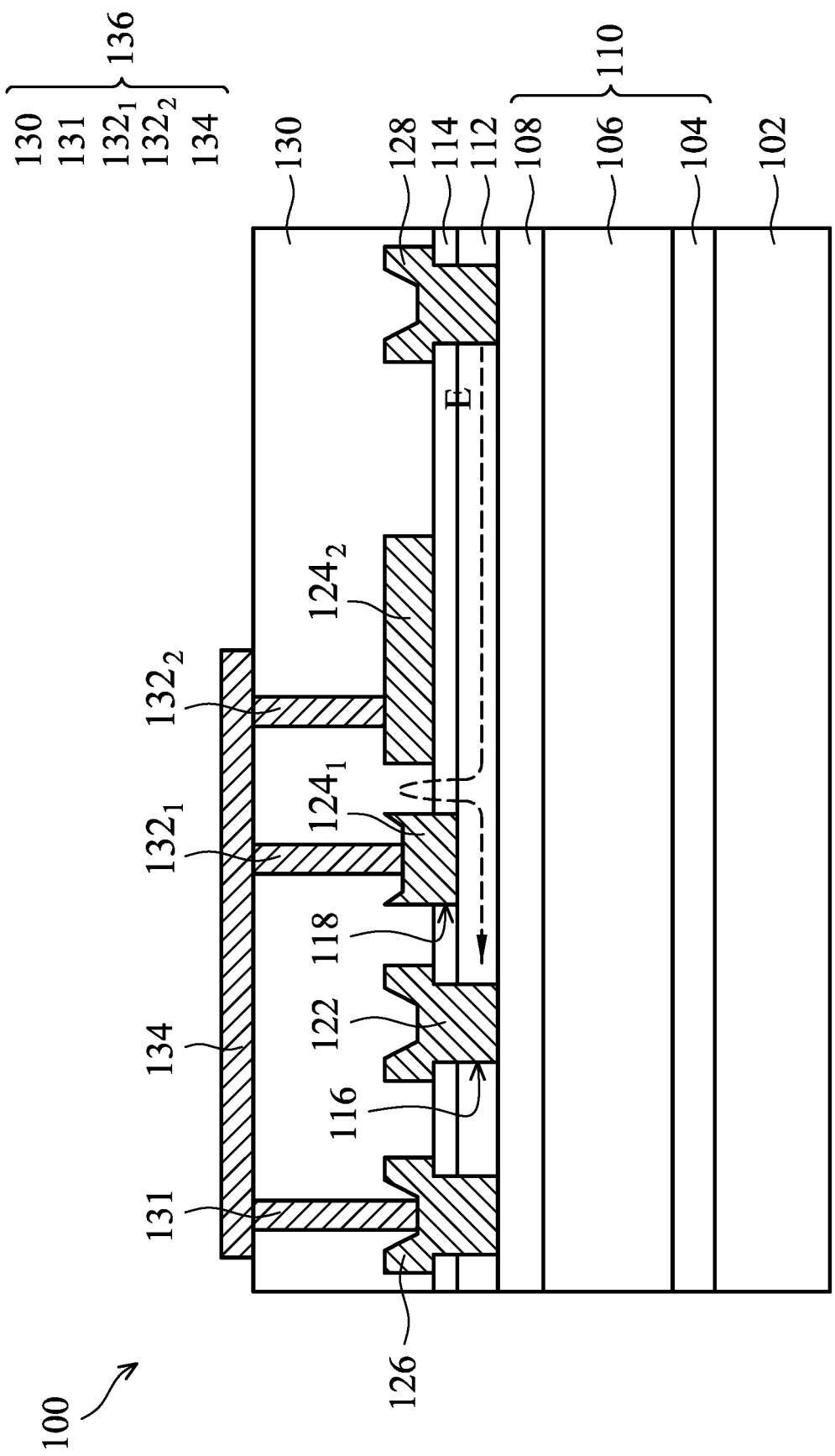

FIGS. 1A-1E illustrate cross-sectional views of forming a semiconductor device 100 shown in FIG. 1E at intermediate stages in accordance with some embodiments of the present disclosure.

Referring to FIG. 1A, a substrate 102 is provided. A compound semiconductor layer 110 is formed on the substrate 102. In some embodiments, the compound semiconductor layer 110 includes a buffer layer 104 formed on the substrate 102, a gallium nitride (GaN) semiconductor layer 106 formed on the buffer layer 104, and an aluminum gallium nitride ($Al_xGa_{1-x}N$, wherein $0<x<1$) semiconductor layer 108 formed on the GaN semiconductor layer 106. In some embodiments, the compound semiconductor layer 110 may also include a seed layer between the substrate 102 and the buffer layer 104.

In some embodiments, the substrate 102 may be a doped (such as doped with a p-type or an n-type dopant) or an undoped semiconductor substrate, such as a silicon substrate, a silicon germanium substrate, a gallium arsenide substrate or the like. In some embodiments, the substrate 102 may be a semiconductor-on-insulator substrate, such as a silicon-on-insulator (SOI) substrate. In some embodiments, the substrate 102 may be a silicon carbide (SiC) substrate or a sapphire substrate.

The buffer layer 104 may be helpful to mitigate a strain of the GaN semiconductor layer 106 which is subsequently formed over the buffer layer 104, and to prevent defects formed in the overlying GaN semiconductor layer 106. The strain is caused by a mismatch between the GaN semiconductor layer 106 and the substrate 102. In some embodiments, the material of the buffer layer 104 may be AlN, GaN, $Al_xGa_{1-x}N$ (wherein $0<x<1$), a combination thereof, or the like. The buffer layer 104 may be formed by using an epitaxial growth process, such as metal organic chemical vapor deposition (MOCVD), hydride vapor phase epitaxy (HVPE), molecular beam epitaxy (MBE), a combination thereof or the like. Although in the embodiment as shown in FIG. 1A the buffer layer 104 is a single layer, the buffer layer 104 may also be a multilayered structure.

Two-dimensional electron gas (2DEG, not shown) is formed at a heterogeneous interface between the GaN semiconductor layer 106 and the AlGaN semiconductor layer 108. The semiconductor device 100 as shown in FIG. 1E is a high electron mobility transistors (HEMT) which utilizes 2DEG as conductive carriers. In some embodiments, the GaN semiconductor layer 106 and the AlGaN semiconductor layer 108 may have no dopant therein. In some other embodiments, the GaN semiconductor layer 106 and the AlGaN semiconductor layer 108 may be doped, such as with an n-type or a p-type dopant. In some embodiments of the present disclosure, the GaN semiconductor layer 106 and the AlGaN semiconductor layer 108 may be formed by using epitaxial growth processes, such as MOCVD, HVPE, MBE, a combination thereof or the like.

Still referring to FIG. 1A, a first protection layer 112 is formed on the AlGaN semiconductor layer 108 of the compound semiconductor layer 110. A second protection layer 114 is formed on the first protection layer 112. In some embodiments, the materials of the first protection layer 112 and the second protection layer 114 may be insulation materials or dielectric materials, such as silicon oxide ($SiO_2$), silicon nitride (SiN), silicon oxynitride (SiON), aluminum oxide ($Al_2O_3$), aluminum nitride (AlN), magnesium oxide (MgO), magnesium nitride ($Mg_3N_2$), Zinc oxide (ZnO), titanium oxide ($TiO_2$) or a combination thereof. The first protection layer 112 and the second protection layer 114 are used to prevent leak current generated from the underlying AlGaN semiconductor layer 108 from flowing to the gate electrode 122, the source electrode 126 and the drain electrode 128 formed subsequently (shown in FIG. 1E). The first protection layer 112 and the second protection layer 114 may be formed by using chemical vapor deposition (CVD), plasma enhanced CVD (PECVD), atomic layer deposition (ALD) or the like. In some embodiments, the material of the second protection layer 114 is different from the material of the first protection layer 112. For example, the overlying second protection layer 114 may be selected form dielectric materials having low dielectric constant (low-k), and the underlying first protection layer 112 may be selected from dielectric materials having high critical voltage for the breakdown voltage.

Referring to FIG. 1B, a patterning process is performed on the first protection layer 112 and the second protection layer 114 to form a first opening 116 which penetrates the second protection layer 114 and the first protection layer 112 and exposes the top surface of the AlGaN semiconductor layer 108. In some embodiments, the steps of the patterning process may include forming a patterned photoresist layer (not shown) on the second protection layer 114 by using a photolithography process, performing an etching process, such as a dry etching or a wet etching, on the first protection layer 112 and the second protection layer 114 through an opening (not shown) of the patterned photoresist layer to form the first opening 116, and then removing the patterned photoresist layer on the second protection layer 114.

Next, a patterning process is performed on the second protection layer 114 to form a second opening 118 which penetrates the second protection layer 114 and exposes the top surface of the first protection layer 112.

Referring to FIG. 1C, a metal material layer 120 is formed on the second protection layer 114 and fills the first opening 116 and the second opening 118. In some embodiments, the metal material layer 120 may be gold (Au), nickel (Ni), platinum (Pt), palladium (Pd), iridium (Ir), titanium (Ti), chromium (Cr), tungsten (W), aluminum (Al), copper (Cu), a combination thereof, multilayers thereof or the like. The metal material layer 120 may be formed by using ALD, CVD, physical vapor deposition (PVD), sputtering or the like.

Referring to FIG. 1D, a patterning process is performed on the metal material layer 120 shown in FIG. 1C to form a gate electrode 122 filling the first opening 116, a first field plate $124_1$ filling the second opening 118, and a second field plate $124_2$ on the second protection layer 114. The first field plate $124_1$ is disposed between the gate electrode 122 and the second field plater $124_2$, and the gate electrode 122, the first field plate $124_1$ and the second field plate $124_2$ are separated from each other. The gate electrode 122 which fills the first opening 116 is in contact with AlGaN semiconductor layer 108 of the compound semiconductor layer 110, and the gate electrode 122 has portions that extend on the surface of the second protection layer 114. The first field plate 124$_1$ which fills the second opening 118 is in contact with the first protection layer 112. In some embodiments, the steps of the patterning process may include forming a patterned photoresist layer (not shown) on the metal material layer 120 shown in FIG. 1C by using a photolithography process, performing an etching process, such as a dry etching and a wet etching, on the metal material layer 120 to remove portions of the metal material layer 120 uncovered by the patterned photoresist layer, and then removing the pattern photoresist layer on the remaining portion of the metal material layer 120.

Since the first field plate 124$_1$ and the second field plate 124$_2$ are formed along with the gate electrode 122 by using the patterning process performed on the metal material layer 120, one deposition process and one etching process for forming the first field plate 124$_1$ and the second field plate 124$_2$ can be saved so as to improve the production efficiency for fabricating the semiconductor device. As shown in FIGS. 1C and 1D, a topmost portion 120T of the metal material layer 120 is level, such that after the patterning process, the topmost portion 120T of the gate electrode 122, the topmost portion 120T of the first field plate 124$_1$, and the topmost portion 120T of the second field plate 124$_2$ are coplanar with each other.

Although in the embodiment as shown in FIG. 1D a first width W1 of the first field plate 124$_1$ is less than a second width W2 of the second field plate 124$_2$, in other embodiments the first width W1 of the first field plate 124$_1$ may be greater than the second width W2 of the second field plate 124$_2$.

Referring to FIG. 1E, a source electrode 126 and a drain electrode 128 which penetrate the second protection layer 114 and the first protection layer 112 are formed. The source electrode 126 and the drain electrode 128 are in contact with the AlGaN semiconductor layer 108 of the compound semiconductor layer 110. The gate electrode 122 is between the source electrode 126 and the drain electrode 128, and the first field plate 124$_1$ and the second field plate 124$_2$ are between the gate electrode 122 and the drain electrode 128. In some embodiments, the materials of the source electrode 126 and the drain electrode 128 may be a metal material, such as Au, Ni, Pt, Pd, Ir, Ti, Cr, W, Al, Cu, a combination thereof or multilayers thereof. The steps of forming the source electrode 126 and the drain electrode 128 may include forming openings (not shown) for the source electrode 126 and the drain electrode 128, which penetrate the second protection layer 114 and the first protection layer 112 and expose the top surface of the AlGaN semiconductor layer 108, by using a patterning process, depositing a metal material layer (not shown) on the second protection layer 114 and filling the openings for the source electrode 126 and the drain electrode 128, and performing a patterning process on the metal material layer to form the source electrode 126 and the drain electrode 128. The deposition process of forming the source electrode 126 and the drain electrode 128 may be ALD, CVD, PVD, sputtering or the like.

Still referring FIG. 1E, an interlayer dielectric (ILD) layer 130 is formed over the second protection layer 114, and the ILD layer 130 covers the gate electrode 122, the first field plate 124$_1$, the second field plate 124$_2$, the source electrode 126 and the drain electrode 128. A source contact 131 which is in connection with the source electrode 126 is formed in the ILD layer 130. A first field plate contact 132$_1$ and a second field plate contact 132$_2$ which are in connection with the first field plate 124$_1$ and the second field plate 124$_2$ respectively are formed in the ILD layer 130. A conductive line 134 which is in connection with the source contact 131, the first field plate contact 132$_1$ and the second field plate contact 132$_2$ is formed on the ILD layer 130. The ILD layer 130, the source contact 131, the first field plate contact 132$_1$, the second field plate contact 132$_2$ and the conductive line 134 constitute an interconnection structure 136. In the embodiments of present disclosure, the first field plate 124$_1$ and the second field plate 124$_2$ are in electrical connection with the source electrode 126 through the interconnection structure 136, and thus the first field plate 124$_1$ and the second field plate 124$_2$ shown in FIG. 1E are source field plates (SFPs). In some embodiments, the interconnection structure 136 further includes a gate contact (not shown) which is in connection with the gate electrode 122. After the interconnection structure 136 is formed, a semiconductor device 100 is formed.

In some embodiments, the material of the ILD layer 130 may be silicon oxide, silicon nitride, silicon oxynitride or aluminum oxide. The ILD layer 130 may be form by using CVD, PECVD, ALD or the like.

In some embodiments, the materials of the source contact 131, the first field plate contact 132$_1$, the second field plate contact 132$_2$, the conductive line 134 may be a metal material, such as Au, Ni, Pt, Pd, Ir, Ti, Cr, W, Al, Cu, a combination thereof, or multilayers thereof. The steps of forming the source contact 131, the first field plate contact 132$_1$ and the second field plate contact 132$_2$ may include forming openings (not shown) which correspond to the source electrode 126, the first field plate 124$_1$ and the second field plate 124$_2$ respectively and penetrate the ILD layer 130 to expose the source electrode 126, the first field plate 124$_1$ and the second field plate 124$_2$ by using a patterning process, depositing a metal material (not shown) on the ILD layer 130 and filling the openings, and then performing a planarization process to remove a portion of the metal material over the ILD layer 130. Next, a conductive line 134 which is in connection with the source contact 131, the first field plate contact 132$_1$ and the second field plate contact 1312 is formed on the ILD layer 130 by using a deposition process and a patterning process.

In the embodiments shown in FIG. 1E, the semiconductor device 100 includes the compound semiconductor layer 110 on the substrate 102, and the compound semiconductor layer 110 includes the buffer layer 104, the GaN semiconductor layer 106 and the AlGaN semiconductor layer 108 sequentially stacked. The semiconductor device 100 further includes the first protection layer 112 disposed on the AlGaN semiconductor layer 108, the second protection layer 114 disposed on the first protection layer 112, and the source electrode 126, the drain electrode 128 and the gate electrode 122 penetrating the second protection layer 114 and the first protection layer 112 and on the AlGaN semiconductor layer 108. The gate electrode 122 is disposed between the source electrode 126 and the drain electrode 128. The semiconductor device 100 further includes the first field plate 124$_1$ disposed between the gate electrode 122 and the drain electrode 128, and the second field plate 124$_2$ disposed between the drain electrode 128 and the first field plate 124$_1$ and on the second protection layer 114. The first field plate 124$_1$ penetrates the second protection layer 114 and on the first protection layer 112. The gate electrode 122, the first field plate 124$_1$ and the second field plate 124$_2$ are separated from each other.

Still referring FIG. 1E, when operating voltages are applied to the gate electrode 122 and the drain electrode 128, an electric force line E is generated from the drain electrode 128 emitting to the gate electrode 122. It should be noted that since there are the separated field plate $124_1$ and $124_2$ between the gate electrode 122 and the drain electrode 128, the path of the electric force line E from the drain electrode 128 emitting to the gate electrode 122 extends into a region between the first field plate $124_1$ and the second field plate $124_2$ rather than from the drain electrode 128 straightly emitting to the gate electrode 122. The electric force line E which extends into the region between the first field plate $124_1$ and the second field plate $124_2$ has a longer path than that of an electric force line which straightly emits to the gate electrode 122, and thus such electric force line E mitigates the electric field gradient at the side of the gate electrode 122 proximate the drain electrode 128. Therefore, the embodiments of the present disclosure utilize the first field plate $124_1$ and the second field plate $124_2$ between the gate electrode 122 and the drain electrode 128 to provide the semiconductor device 100 a good balance between the breakdown voltage and the gate-to-drain capacitance (Co). This, in turn, enhances the performance of the semiconductor device 100.

In addition, since the semiconductor device 100 has the first protection layer 112 and the second protection layer 114 which material is different from that of the first protection layer 112, the Co of the semiconductor device 100 can be further reduced. Furthermore, since the first field plate $124_1$ proximate the gate electrode 122 is disposed on the first protection layer 112 and there is a height difference between the first field plate $124_1$ and the second field plate $124_2$, the electric field gradient from the drain electrode 128 emitting to the gate electrode 122 can be further mitigated. This, in turn, enhances the breakdown voltage of the semiconductor device 100.

Figure 2A:
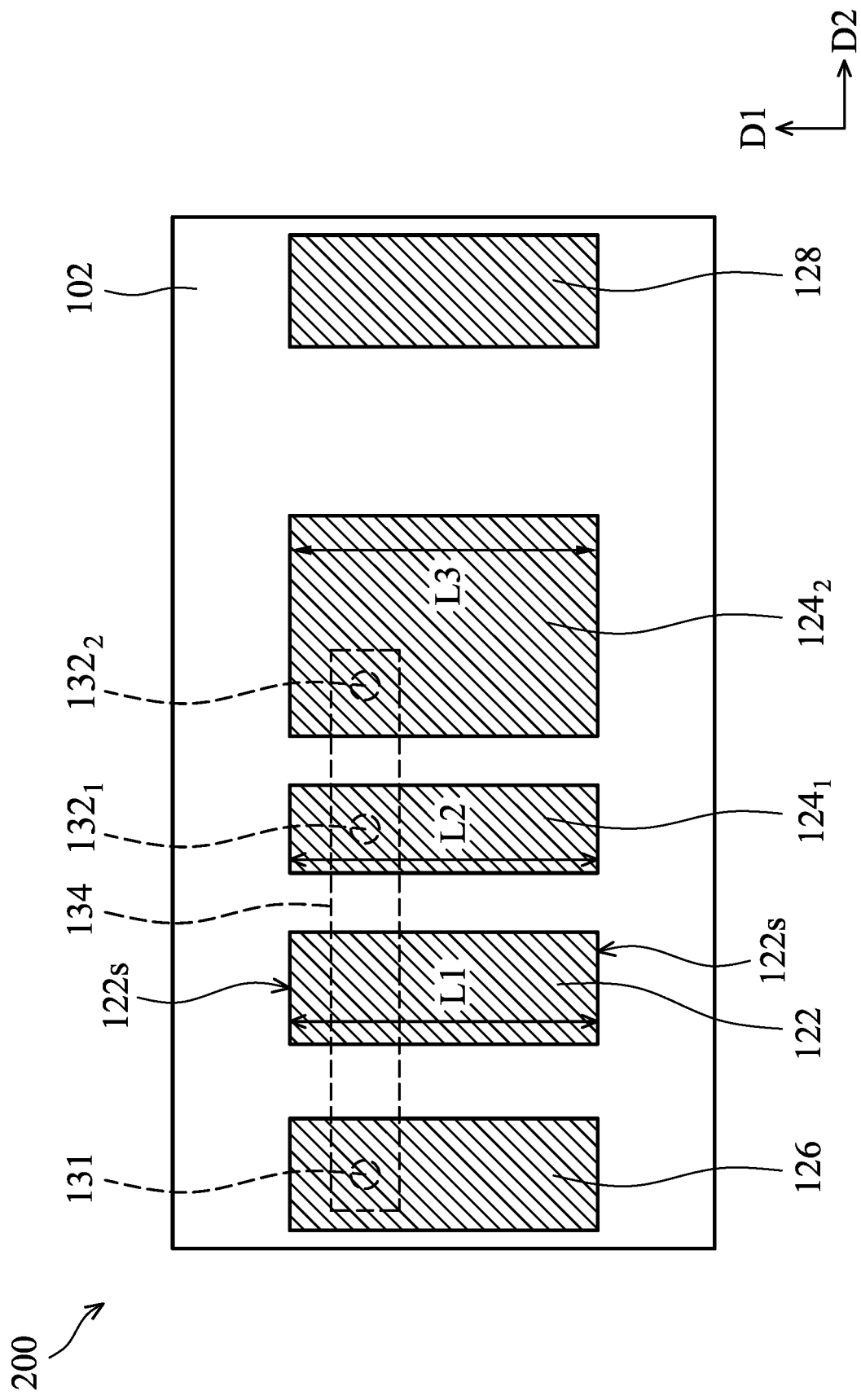
FIGS. 2A-2C show top views of semiconductor devices in accordance with some embodiments of the present disclosure.
Figure 2B:
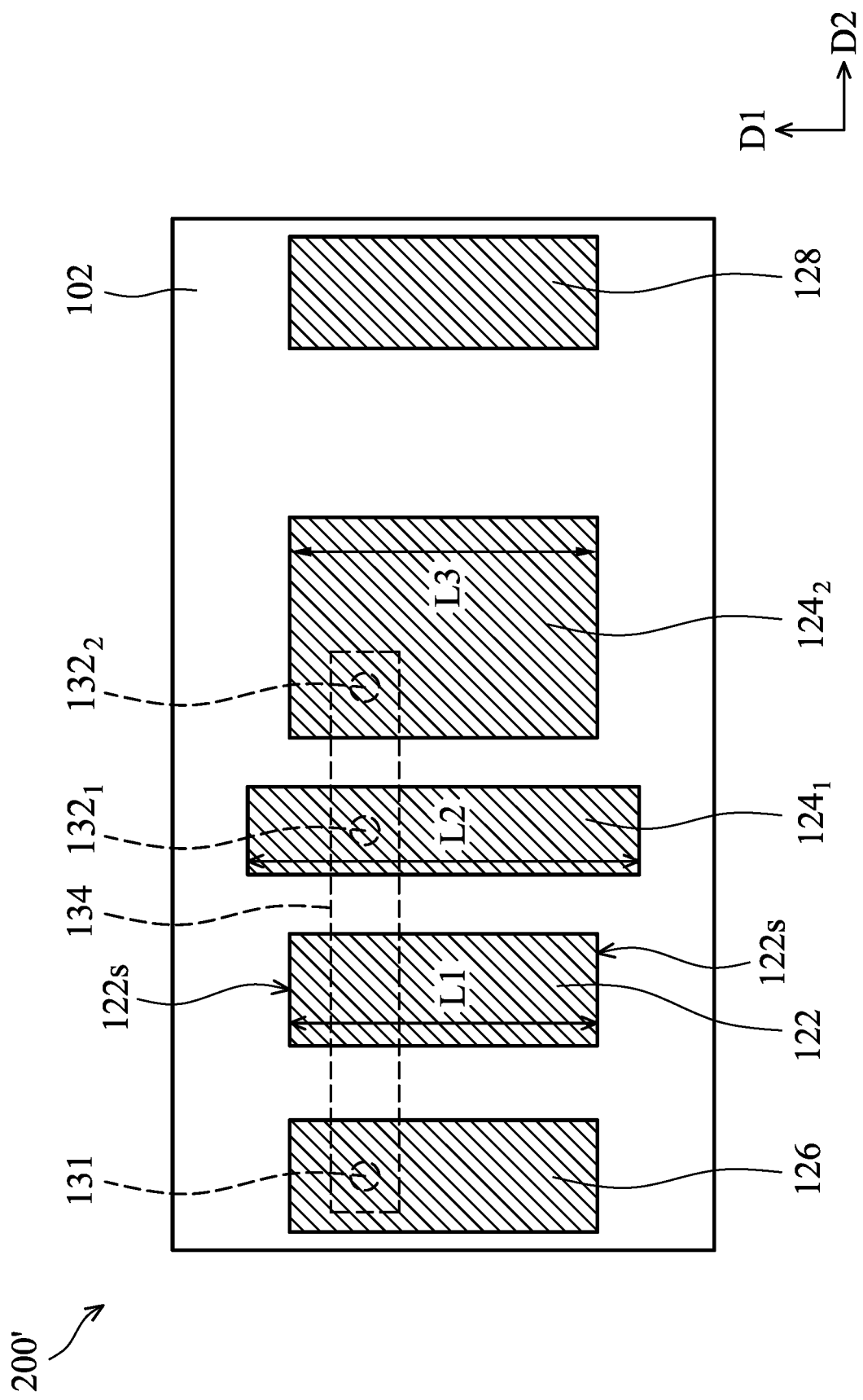
Figure 2C:
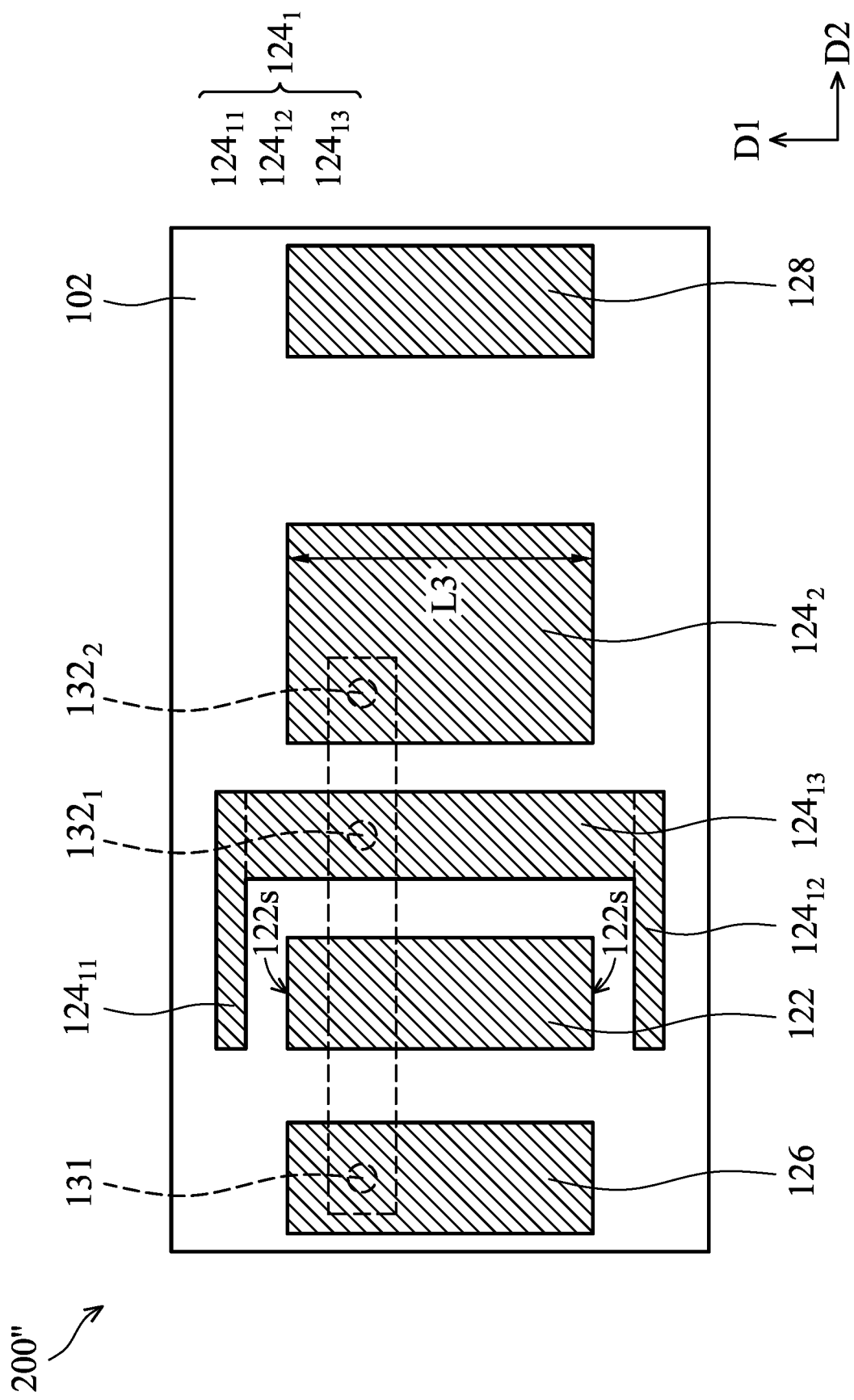

FIGS. 2A-2C show top views of semiconductor devices 200, 200' and 200" in accordance with some embodiments of the present disclosure.

Referring to FIGS. 2A and 2B, the respective longitudinal axes of the gate electrode 122 and the first field plate $124_1$ are parallel to a first direction D1, and a current direction between the source electrode 126 and the drain electrode 128 is parallel to a second direction D2 which is perpendicular to the first direction D1. In the embodiment shown in FIG. 2A, a first longitudinal length L1 of the gate electrode 122 is equal to a second longitudinal length L2 of the first field plate $124_1$. In the embodiment shown in FIG. 2B, the first longitudinal length L1 of the gate electrode 122 is less than the second longitudinal length L2 of the first field plate $124_1$. Since the first longitudinal length L1 of the gate electrode 122 is equal to or less than the second longitudinal length L2 of the first field plate $124_1$, the effect on mitigating the electric field gradient at the side of the gate electrode 122 proximate the drain electrode 128 by the first field plate $124_1$ and the second field plate $124_2$ can extend to opposite sides $122s$ of the gate electrode 122 in its longitudinal axis.

In the embodiment shown in FIG. 2A, the second longitudinal length L2 of the first field plate $124_1$ is equal to a third longitudinal length L3 of the second field plate $124_2$. In the embodiment shown in FIG. 2B, the second longitudinal length L2 of the first field plate $124_1$ is greater than the third longitudinal length L3 of the second field plate $124_2$. In some other embodiments, the second longitudinal length L2 of the first field plate $124_1$ may be less than the third longitudinal length L3 of the second field plate $124_2$.

Referring to FIG. 2C, in another embodiment, the first field plate $124_1$ includes a first portion $124_{11}$, a second portion $124_{12}$ and a third portion $124_{13}$ between the first portion $124_{11}$ and the second portion $124_{12}$. The opposite ends of the third portion $124_{13}$ are in connection with the first portion $124_{11}$ and the second portion $124_{12}$ respectively. The longitudinal axis of the third portion $124_{13}$ is parallel to the longitudinal axis of the gate electrode 122, and the respective longitudinal axes of the first portion $124_{11}$ and the second portion $124_{12}$ are perpendicular to the longitudinal axis of the third portion $124_{13}$. The first portion $124_{11}$ and the second portion $124_{12}$ extend toward the source electrode 126. Since the first field plate $124_1$ shown in FIG. 2C surrounds three sides of the gate electrode 122, the effect on mitigating the electric field gradient at the side of the gate electrode 122 proximate the drain electrode 128 by the first field plate $124_1$ and the second field plate $124_2$ can fully extend to opposite sides $122s$ of the gate electrode 122 in its longitudinal axis.

Figure 3:
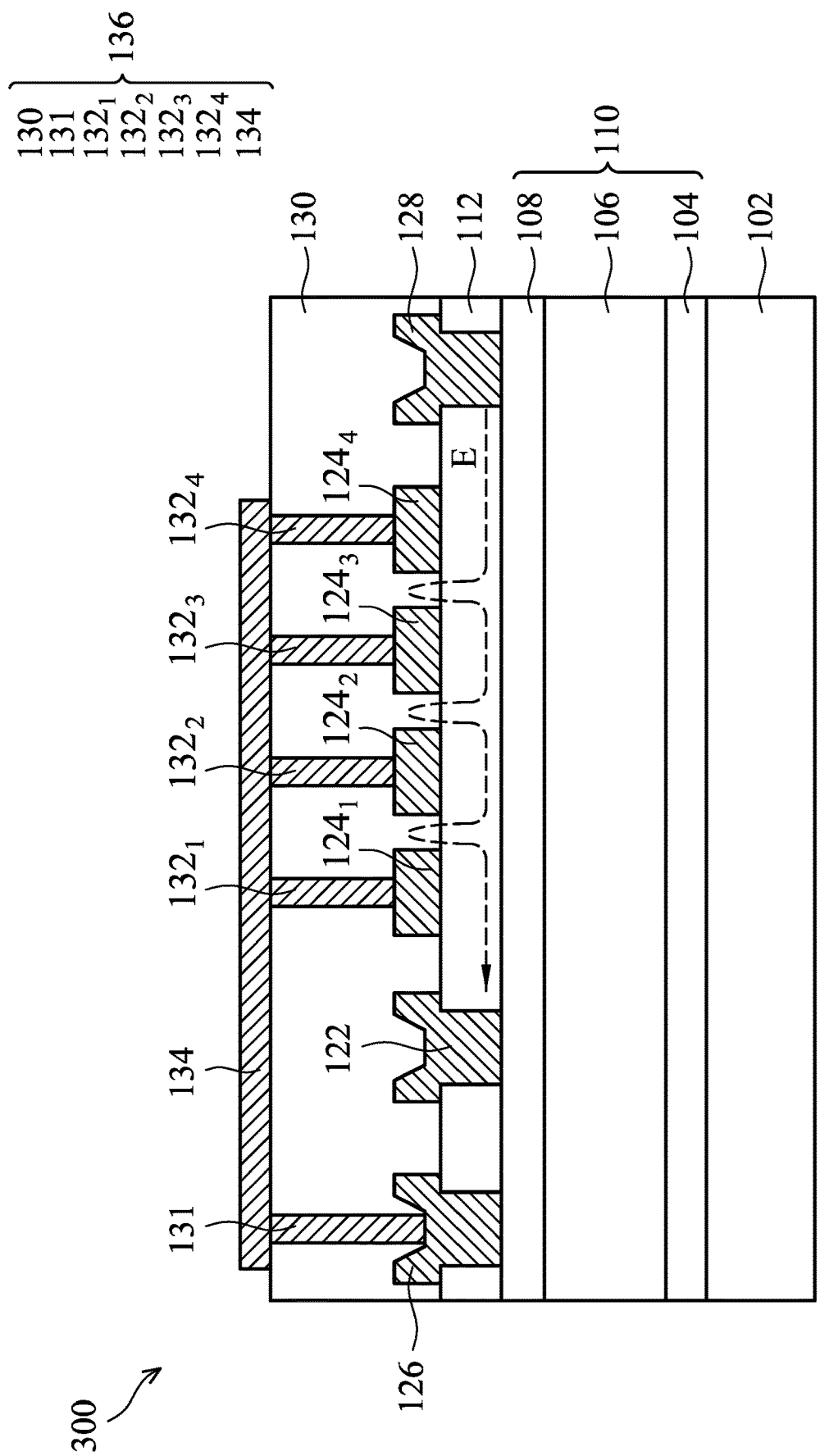
FIGS. 3 and 4 show cross-sectional views of a semiconductor device in accordance with some other embodiments of the present disclosure.

FIG. 3 illustrates a cross-sectional view of a semiconductor device 300 in accordance with some other embodiments of the present disclosure. The difference between the embodiments shown in FIG. 3 and FIG. 1E is that the semiconductor device 300 has four field plates $124_1$ to $124_4$ which are in connection with the conductive line 134 through field plate contacts $132_1$ to $132_4$ respectively, and that the semiconductor device 300 has no second protection layer 114.

Referring to FIG. 3, after the first protection layer 112 is formed on the AlGaN semiconductor layer 108 of the compound semiconductor layer 110, the first opening 116 penetrating the first protection layer 112 and exposing the AlGaN semiconductor layer 108 is formed. Next, a metal material layer (not shown) is formed on the first protection layer 112 and fills the first opening 116. A patterning process is then performed on the metal material layer to form the gate electrode 122 filling the first opening 116 and the first field plate $124_1$, the second field plate $124_2$, the third field plate 1243 and the fourth field plate $124_4$ on the first protection layer 112. Thereafter, the semiconductor device 300 is formed by using the same or similar process steps described above in FIG. 1E. Although the semiconductor device 300 shown in FIG. 3 has the four field plates $124_1$ to $124_4$, in some other embodiments the semiconductor device 300 may have two, three or more than four field plates, and these field plates are all disposed on the first protection layer 112.

In the embodiment shown in FIG. 3, the semiconductor device 300 includes the compound semiconductor layer 110 on the substrate 102, and the compound semiconductor layer 110 includes the buffer layer 104, the GaN semiconductor layer 106 and the AlGaN semiconductor layer 108 sequentially stacked. The semiconductor device 300 further includes the first protection layer 112 disposed on the AlGaN semiconductor layer 108, and the source electrode 126, the drain electrode 128 and the gate electrode 122 penetrating the first protection layer 112 and on the AlGaN semiconductor layer 108. The gate electrode 122 is disposed between the source electrode 126 and the drain electrode 128. The semiconductor device 300 further includes the first field plate $124_1$, the second field plate $124_2$, the third field plate 1243 and the fourth field plate $124_4$ disposed on the first protection layer 112 and between the gate electrode 122 and the drain electrode 128. The first field plate $124_1$, the second field plate $124_2$, the third field plate 1243 and the fourth field plate $124_4$ are separated from each other.

In addition, the first field plate $124_1$, the second field plate $124_2$, the third field plate 1243 and the fourth field plate $124_4$ are in electrical connection with the source electrode 126 through the interconnection structure 136, and thus these field plates $124_1$ to $124_4$ are source field plates (SFPs).

As described above, the path of the electric force line E from the drain electrode 128 emitting to the gate electrode 122 can extend into regions between the neighboring field plates (such as, the third field plate 1243 and the fourth field plate $124_4$, the second field plate $124_2$ and the third field plate 1243, and the first field plate $124_1$ and the second field plate $124_2$) rather than from the drain electrode 128 straightly emitting to the gate electrode 122. Therefore, the embodiments of the present disclosure utilize the several separated field plates $124_1$ to $124_4$ between the gate electrode 122 and the drain electrode 128 to provide the semiconductor device 300 a good balance between the breakdown voltage and the gate-to-drain capacitance (Co). This, in turn, enhances the performance of the semiconductor device 300.

Figure 4:
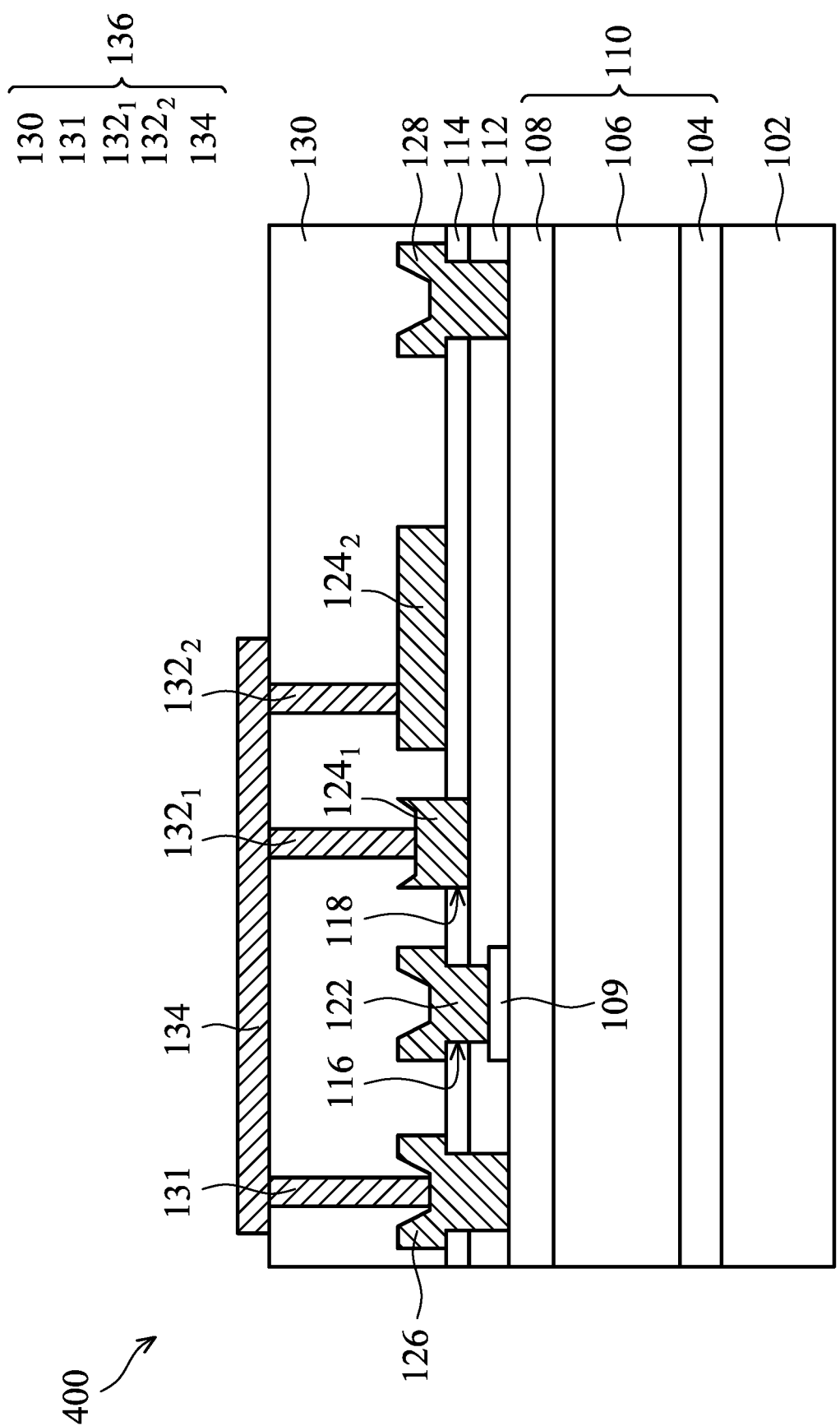

FIG. 4 illustrates a cross-sectional view of a semiconductor device 400 in accordance with some other embodiments of the present disclosure. The difference between the embodiments shown in FIG. 4 and FIG. 1E is that the semiconductor 400 shown in FIG. 4 further includes a doped compound semiconductor region 109 disposed between the gate electrode 122 and the AlGaN semiconductor layer 108.

Referring to FIG. 4, after the compound semiconductor layer 110 is formed on the substrate 102, a doped compound semiconductor region 109 is formed on the AlGaN semiconductor layer 108 of the compound semiconductor layer 110. The first protection layer 112 and the second protection layer 114 are formed over the doped compound semiconductor region 109. The first opening 116 penetrates the second protection layer 114 and the first protection layer 112 and exposes the doped compound semiconductor region 109. The gate electrode 122 fills the first opening 116 and is in contact with the doped compound semiconductor region 109. The generation of 2DEG under the gate electrode 122 can be inhibited by the doped compound semiconductor region 109 disposed between the gate electrode 122 and the AlGaN semiconductor layer 108 so as to attain a normally-off status of the semiconductor device 400. In some embodiments, the material of the doped compound semiconductor layer 109 may be GaN which is doped with a p-type dopant or an n-type dopant. The steps of forming the doped compound semiconductor region 109 may include depositing a doped compound semiconductor layer (not shown) on the AlGaN semiconductor layer 108 by using an epitaxial growth process, and performing a patterning process on the doped compound semiconductor layer to form the doped compound semiconductor region 109 corresponding to the predetermined position where the gate electrode 122 is to be formed.

In summary, the embodiments of the present disclosure utilize the several separated SFPs between the gate electrode and the drain electrode to mitigate the electric field gradient at the side of the gate electrode proximate the drain electrode. Therefore, the semiconductor device of the embodiments of the present disclosure has a good balance between the breakdown voltage and the gate-to-drain capacitance (Co). This, in turn, enhances the performance of the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a compound semiconductor layer disposed on a substrate;
a protection layer disposed on the compound semiconductor layer;
a source electrode, a drain electrode and a gate electrode penetrating the protection layer and on the compound semiconductor layer, wherein the gate electrode is disposed between the source electrode and the drain electrode; and
a plurality of field plates disposed over the protection layer and between the gate electrode and the drain electrode, wherein the plurality of field plates are separated from each other, wherein the gate electrode has a non-planar top surface, and the plurality of field plates simultaneously comprising a first field plate of the non-planar top surface and a second field plate of a planar top surface.

2. The semiconductor device as claimed in claim 1, wherein the gate electrode is separated from the plurality of field plates.

3. The semiconductor device as claimed in claim 1, wherein the gate electrode and the plurality of field plates are formed of a same metal material layer.

4. The semiconductor device as claimed in claim 1, wherein the second field plate is between the first field plate and the drain electrode.

5. The semiconductor device as claimed in claim 4, wherein from a top view, a first longitudinal length of the gate electrode is equal to or smaller than a second longitudinal length of the first field plate.

6. The semiconductor device as claimed in claim 4, wherein from a top view, the first field plate includes a first portion, a second portion and a third portion between the first portion and the second portion, and opposite ends of the third portion are in connection with the first portion and the second portion respectively, wherein a longitudinal axis of the third portion is parallel with a longitudinal axis of the gate electrode, and a longitudinal axis of the first portion and a longitudinal axis of the second portion are perpendicular to the longitudinal axis of the third portion, and wherein the first portion and the second portion extend toward the source electrode respectively.

7. The semiconductor device as claimed in claim 4, further comprising a doped compound semiconductor region disposed between the gate electrode and the compound semiconductor layer.

8. The semiconductor device as claimed in claim 1, wherein the plurality of field plates are in electrical connection with the source electrode.

9. The semiconductor device as claimed in claim 7, wherein the protection layer comprises a first protection layer and a second protection layer.

10. The semiconductor device as claimed in claim 9, wherein a bottom surface of the first field plate lands on a top surface of the first protection layer, and a bottom surface of the second field plate lands on a top surface of the second protection layer.

11. The semiconductor device as claimed in claim 9, wherein a material of the second protection layer is different from a material of the first protection layer.

12. The semiconductor device as claimed in claim 9, further comprising an interconnection structure disposed over the second protection layer, wherein the first field plate and the second field plate are in electrical connection with the source electrode through the interconnection structure.

13. The semiconductor device as claimed in claim 9, wherein the gate electrode comprises an upper portion covering the top surface of the second protection layer.

14. The semiconductor device as claimed in claim 9, wherein the doped compound semiconductor region is embedded in the first protection layer.

15. The semiconductor device as claimed in claim 4, wherein topmost portions of the gate electrode, the first field plate, and the second field plate are coplanar with each other.

* * * * *